United States Patent [19]
Hamilton

[11] Patent Number: 5,408,568
[45] Date of Patent: Apr. 18, 1995

[54] ELECTRONIC CIRCUIT BOARD WITH INTERNAL OPTICALLY TRANSMISSIVE LAYER FORMING OPTICAL BUS

[75] Inventor: Phillip G. B. Hamilton, Congleton, England

[73] Assignee: International Computers Limited, London, England

[21] Appl. No.: 161,049

[22] Filed: Dec. 1, 1993

[30] Foreign Application Priority Data

Dec. 3, 1992 [GB] United Kingdom ............... 9225273

[51] Int. Cl.⁶ ........................... G02B 6/00; G02B 6/36
[52] U.S. Cl. ................................ 385/132; 385/129
[58] Field of Search ............................ 385/129–132

[56] References Cited

U.S. PATENT DOCUMENTS

| | | | |
|---|---|---|---|
| 4,585,299 | 4/1986 | Strain | 385/132 |
| 4,762,382 | 8/1988 | Husain et al. | 385/132 |
| 4,799,749 | 1/1989 | Borner et al. | 385/132 X |
| 4,809,358 | 2/1989 | Fernström | 455/600 |
| 4,830,447 | 5/1989 | Kamiyama et al. | 385/129 X |
| 4,834,480 | 5/1989 | Baker et al. | 385/132 X |
| 4,893,162 | 1/1990 | Gentner et al. | 385/132 X |
| 5,061,029 | 10/1991 | Ishikawa | 385/132 |
| 5,230,030 | 7/1993 | Hartman et al. | 395/50 |

FOREIGN PATENT DOCUMENTS 0272027  6/1988  European Pat. Off.
61-117882  6/1986  Japan.

*Primary Examiner*—Akm E. Ullah
*Attorney, Agent, or Firm*—Lee, Mann, Smith, McWilliams, Sweeney & Ohlson

[57] ABSTRACT

A method of constructing an electronic circuit assembly comprises forming a circuit board having first and second sets of circuit layers and an internal optically transmissive layer, sandwiched between the first and second sets of circuit layers. Holes are formed through the first set of circuit layers by excimer laser drilling, the holes extending as far as the optically transmissive layer without passing through that layer. Electronic devices are mounted on the circuit board over said holes, at least some of the devices including optical receiver and/or transmitter means for receiving/transmitting optical signals from/to the optically transmissive layer. An optical fibre is coupled to the optically transmissive layer. The optically transmissive layer thus acts as a bus interconnecting the devices.

5 Claims, 1 Drawing Sheet

ELECTRONIC CIRCUIT BOARD WITH INTERNAL OPTICALLY TRANSMISSIVE LAYER FORMING OPTICAL BUS

BACKGROUND OF THE INVENTION

This invention relates to electronic circuit assemblies.

It is well known to transmit data signals by way of optical fibres. Optical transmission has the advantage of high bandwidth and high clock rates, while providing electrical isolation between transmitter and receiver.

Conventionally, when optical data is received by a circuit assembly, it is converted into electrical signals, and these electrical signals are then routed by way of printed circuit tracks to individual devices (chips) in the assembly. Because the clock rate of the optical data is very high, it is usually necessary to provide a serial/parallel conversion, to reduce the clock rate of the electrical signals.

The object of the invention is to provide an improved electronic circuit assembly in which optical signals are handled in a novel and more efficient manner.

SUMMARY OF THE INVENTION

According to the invention there is provided a method of constructing an electronic circuit assembly comprising:
(a) forming a circuit board having first and second sets of circuit layers and an internal optically transmissive layer, sandwiched between the first and second sets of circuit layers,
(b) forming a plurality of holes through the first set of circuit layers by excimer laser drilling, the holes extending as far as the optically transmissive layer without passing through that layer,
(c) mounting a plurality of electronic devices on the circuit board over said holes, at least some of the devices including optical receiver and/or transmitter means for receiving/transmitting optical signals from/to the optically transmissive layer, and
(d) optically coupling an optical fibre to the optically transmissive layer.

Thus, it can be seen that the invention provides, in effect, an optical bus within the circuit board which allows the input signals to remain in optical form up to the individual devices on the board, avoiding the necessity for transmitting data over printed circuit tracks on the board, and avoiding the need for serial/parallel conversion.

BRIEF DESCRIPTION OF THE DRAWINGS

The drawings 1 & 2 are a view of a circuit assembly in accordance with the invention.

DESCRIPTION OF AN EMBODIMENT OF THE INVENTION

Figure 1:
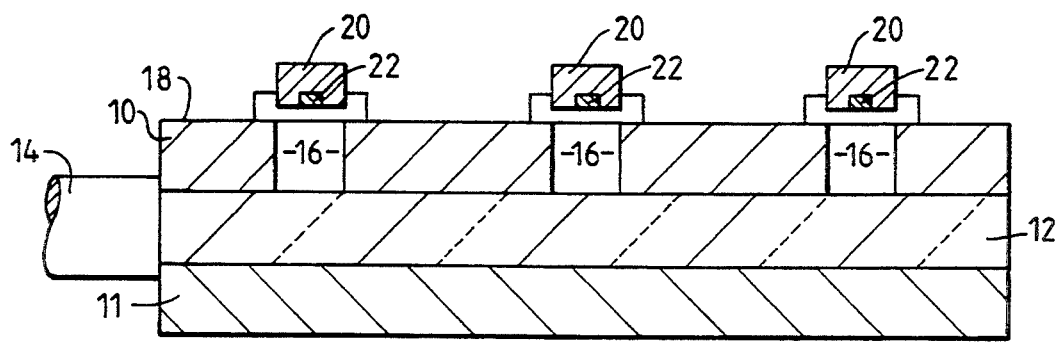
Figure 2:
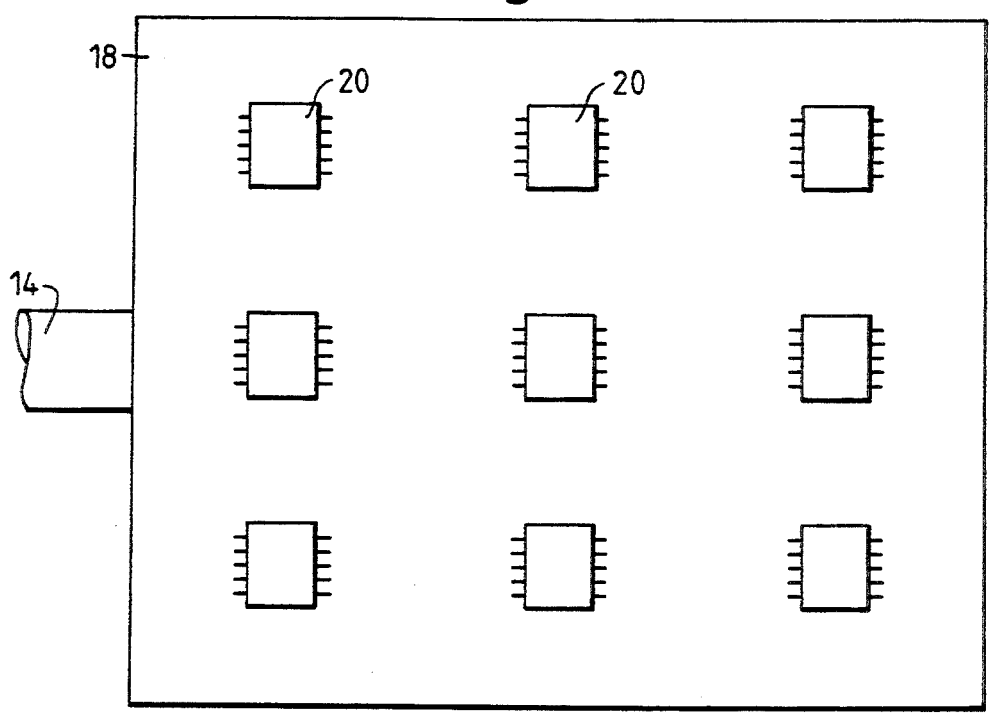

One electronic circuit assembly in accordance with the invention will now be described by way of example with reference to the accompanying drawing.

The circuit assembly comprises a plurality of printed circuit layers 10, 11 and an optically transmissive layer 12, sandwiched between the circuit layers. The upper printed circuit layers 10 are formed from glass-free (eg paper-based) resin material. The lower layers 11 may be conventional glass reinforced layers.

An optical fibre 14 carries input optical signals to the assembly. The end of the fibre 14 is polished flat and is held in abutment to a polished flat surface on the edge of the optical layer 12 by means of a clamp (not shown). Thus, optical signals received along the fibre pass into the optical layer 12, and are propagated through this layer by internal reflections.

The printed circuit layers 10 have a number of holes 16 formed through them, extending from the top surface 18 of the assembly, down to the optical layer 12, but not passing through that layer. The holes 16 are not filled with any material. A number of components (chips) 20 are mounted on the top surface 18, over the holes 16.

Each chip 20 has electrical connections to conductive tracks within the printed circuit layers. These connections, and the conductive tracks, may be conventional in form and so will not be described in any further detail.

Each chip 20 also includes a photodiode, which receives optical signals from the optical layer 12, through the hole 16, and converts these optical signals to electrical signals for processing by the circuits within the chip.

Thus, it can be seen that in the described circuit assembly the optical input signals are distributed by way of the optical layer 12 to all the chips 20.

The holes 16 are formed by excimer laser drilling, as follows.

First a copper mask pattern is formed on the top surface 18, using conventional masking/etching techniques. The mask pattern consists of a number of frames defining the intended position and shape of each of the holes. Each hole is then drilled using an excimer laser with a spot size greater than the dimensions of the required hole but smaller than the external dimensions of the frame. The copper frames thus act as masks, ensuring precise shaping of the holes.

It will be appreciated that although the holes 16 are shown as square in the drawing, they may be other shapes, such as round. In general, the holes should be as small as possible, so as not to reduce excessively the area available for tracks within the printed circuit layers.

The optical layer 12 may also be used for transmitting optical data from the chips 20 back to the optical fibre 14. In this case, at least some of the chips 20 would contain laser diodes for generating output optical signals.

The optical data may include two or more separate data streams at different optical wavelengths, ie the data may be wavelength-division multiplexed. In this case, the photodiode in each receiving chip may be tuned to one particular wavelength, so that it can filter out a selected data stream. Similarly, different chips may include laser diodes tuned to different wavelengths, so as to multiplex the output signals.

I claim:
1. A method of constructing an electronic circuit assembly comprising:
(a) forming a circuit board having first and second sets of circuit layers and an internal continuous optically transmissive layer, sandwiched between the first and second sets of circuit layers,
(b) forming a plurality of holes through the first set of circuit layers by excimer laser drilling, said holes extending from a first surface of said circuit board, through said first set of circuit layers, as far as said optically transmissive layer without passing through said optically transmissive layer,
(c) mounting a plurality of electronic devices on said first surface of said circuit board over said holes, at least some of the devices including optical receiver and transmitter means for receiving and transmitting optical signals from and to the optically transmissive layer, and (d) optically coupling an optical fibre to said optically transmissive layer.

2. An electronic assembly comprising:

(a) a circuit board having first and second sets of circuit layers and an internal continuous optically transmissive layer, sandwiched between the first and second sets of circuit layers, (b) a plurality of holes formed through the first set of circuit layers, said holes extending from a first surface of said circuit board, through said first set of circuit layers, as far as said optically transmissive layer without passing through said optically transmissive layer, (c) a plurality of electronic devices mounted on said first surface of said circuit board over said holes, at least some of the devices including optical receiver and transmitter means for receiving and transmitting optical signals from and to the optically transmissive layer, and (d) an optical fibre, optically coupled to said optically transmissive layer.

3. An electronic assembly according to claim 2 wherein said first set of circuit layers are formed from glass-free resin material.

4. An electronic assembly according to claim 3 wherein said glass-free resin material comprises a paper-based resin material.

5. An electronic assembly according to claim 2 wherein said holes are unfilled.

* * * * *